US 8,482,062 B2

(12) United States Patent
Pfirsch et al.

(10) Patent No.: US 8,482,062 B2
(45) Date of Patent: Jul. 9, 2013

(54) SEMICONDUCTOR DEVICE HAVING A FLOATING SEMICONDUCTOR ZONE

(75) Inventors: Frank Pfirsch, Munich (DE); Maria Cotorogea, Ottobrunn (DE); Franz Hirler, Isen (DE); Franz-Josef Niedernostheide, Muenster (DE); Thomas Raker, Ottobrunn (DE); Hans-Joachim Schulze, Taufkirchen (DE); Hans Peter Felsl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/610,240

(22) Filed: Sep. 11, 2012

(65) Prior Publication Data

US 2013/0001640 A1    Jan. 3, 2013

Related U.S. Application Data

(62) Division of application No. 12/506,844, filed on Jul. 21, 2009, now Pat. No. 8,264,033.

(51) Int. Cl.
*H01L 29/66* (2006.01)

(52) U.S. Cl.
USPC ........... 257/330; 257/135; 257/136; 257/242; 257/329; 257/E29.071; 257/E27.095; 257/E27.096; 438/156; 438/173; 438/206; 438/212

(58) Field of Classification Search
USPC .......... 257/135, 136, 242, 329, 330, E29.071, 257/E27.095, E27.096; 438/156, 173, 192, 438/206, 212
See application file for complete search history.

(56) References Cited

U.S. PATENT DOCUMENTS

| | | |
|---|---|---|
| 5,283,201 A | 2/1994 | Tsang et al. |
| 5,329,142 A | 7/1994 | Kitagawa et al. |
| 5,448,083 A | 9/1995 | Kitagawa et al. |
| 5,585,651 A | 12/1996 | Kitagawa et al. |
| 5,623,152 A | 4/1997 | Majumdar et al. |
| 5,801,417 A | 9/1998 | Tsang et al. |
| 5,894,149 A | 4/1999 | Venishi et al. |
| 5,998,833 A | 12/1999 | Baliga |

(Continued)

FOREIGN PATENT DOCUMENTS

| | | |
|---|---|---|
| DE | 102005004354 | 8/2006 |
| DE | 102006036347 | 4/2008 |
| EP | 1170803 | 10/2002 |
| EP | 1608024 | 12/2005 |

OTHER PUBLICATIONS

Non-Final Office Action for U.S. Appl. No. 12/506,844 mailed Dec. 6, 2011 (7 pages).

*Primary Examiner* — Telly Green
(74) *Attorney, Agent, or Firm* — Dicke, Billig & Czaja, PLLC

(57) ABSTRACT

A semiconductor device includes a first trench and a second trench extending into a semiconductor body from a surface. A body region of a first conductivity type adjoins a first sidewall of the first trench and a first sidewall of the second trench, the body region including a channel portion adjoining to a source structure and being configured to be controlled in its conductivity by a gate structure. The channel portion is formed at the first sidewall of the second trench and is not formed at the first sidewall of the first trench. An electrically floating semiconductor zone of the first conductivity type adjoins the first trench and has a bottom side located deeper within the semiconductor body than the bottom side of the body region.

12 Claims, 10 Drawing Sheets

U.S. PATENT DOCUMENTS

| | | |
|---|---|---|
| 6,111,290 A | 8/2000 | Venishi et al. |
| 6,153,896 A | 11/2000 | Omura et al. |
| 6,171,447 B1 | 1/2001 | Trokhan |
| 6,180,966 B1 | 1/2001 | Kohno et al. |
| 6,191,447 B1 | 2/2001 | Baliga |
| 6,198,127 B1 | 3/2001 | Kocon |
| 6,218,217 B1 | 4/2001 | Venishi et al. |
| 2005/0280078 A1 | 12/2005 | Teramae et al. |
| 2006/0214221 A1 | 9/2006 | Challa et al. |
| 2006/0214222 A1 | 9/2006 | Challa et al. |
| 2007/0272978 A1 | 11/2007 | Mauder et al. |
| 2008/0042172 A1 | 2/2008 | Hirler et al. |
| 2008/0135931 A1 | 6/2008 | Challa et al. |
| 2008/0138953 A1 | 6/2008 | Challa et al. |
| 2008/0150020 A1 | 6/2008 | Challa et al. |
| 2008/0197407 A1 | 8/2008 | Challa et al. |

# SEMICONDUCTOR DEVICE HAVING A FLOATING SEMICONDUCTOR ZONE

CROSS-REFERENCE TO RELATED APPLICATIONS

This Utility patent application is a divisional application of U.S. application Ser. No. 12/506,844, filed Jul. 21, 2009, which is incorporated herein by reference.

BACKGROUND OF THE INVENTION

In semiconductor devices such as Insulated Gate Bipolar Transistors (IGBTs) requirements such as low on-state voltage, low short circuit current, low impact of changes of a collector-emitter-voltage on a gate during switching conditions, low impact of changes of an internal charge carrier distribution on the gate, in particular during switch-on and in short-circuit, and high reverse blocking capability and reliability have to be met. A trade-off between these requirements is common practice.

A need exists for a device having a low impact of changes of an internal charge carrier distribution on the gate, a high reverse blocking capability and a high device reliability.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Features and advantages of embodiments will be apparent from the following description with reference to the accompanying drawings. The drawings are not necessarily to scale and emphasis is placed upon illustrating the principles. The features of the various illustrated embodiments can be combined in any way unless they exclude each other.

DETAILED DESCRIPTION OF THE DRAWINGS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
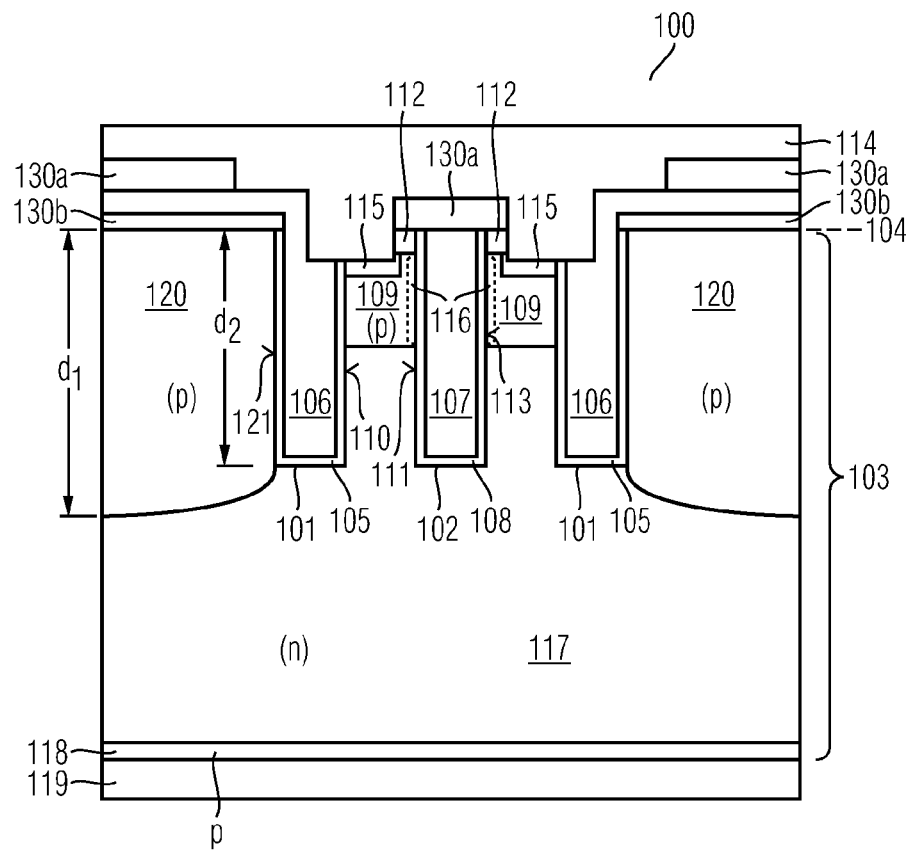
FIG. 1 illustrates one embodiment of a semiconductor device including a cross-sectional view of a portion of an IGBT including an electrically floating semiconductor zone adjoining to a trench.

FIG. 1 illustrates a cross-sectional view of a semiconductor device including a portion of an IGBT 100 according to one embodiment. IGBT 100 includes a first trench 101 and a second trench 102 extending into a semiconductor body 103 from a surface 104 of the semiconductor body 103. Within the first trench 101 an insulating structure 105 and an electrode structure 106 are formed. Within the second trench a gate electrode structure 107 and a gate dielectric structure 108 are formed.

A body region 109 of p-type adjoins to a first sidewall 110 of the first trench 101 and to a first sidewall 111 of the second trench 102. A source structure 112 of n-type adjoins to the first sidewall 111 and to a second sidewall 113 of the second trench 102. Source structure 112 is electrically coupled to an emitter contact 114 and the emitter contact 114 is further electrically coupled to the body region 109 via a p-type contact region 115 and to the electrode structure 106 within the first trench 101. A channel portion 116 that is controlled in its conductivity by the gate electrode structure 107 is formed at the first sidewall 111 and at the second sidewall 113 of the second trench 102. The channel portion 116 is part of the body region 109 and adjoins to the source structure 115 at a top end and to an n-type base zone 117 at a bottom end. A p-type collector region 118 adjoining to a bottom side of the base zone 117 is electrically coupled to a collector contact 119.

An electrically floating semiconductor zone 120 of p-type adjoins to a second sidewall 121 of the first trench 101. In the embodiment illustrated in FIG. 1, a distance $d_1$ from the surface 104 to a bottom side of the electrically floating semiconductor zone 120 is larger than a distance $d_2$ from the surface 104 to a bottom side of the first trench 101. According to other embodiments, the distance $d_1$ may be equal to or less than the distance $d_2$. The electrically floating semiconductor zone 120 counteracts the occurrence of high peak values of an electric field at a bottom edge of the first and second trenches 101, 102 in reverse or short-circuit mode. The electrically floating semiconductor zone 120 furthermore improves flooding of hole carriers within the semiconductor body 103 in an area of the body region 109 and the base zone 117 below body region 109. These hole carriers may be conducted along the first trench between the emitter contact 114 and the collector contact 119. In the embodiment illustrated in FIG. 1, the insulating structure 105 and the gate dielectric structure 108 may be of a same thickness and/or material, e.g., they may be formed in same processes. The electrode structure 106 within the first trench 101 is electrically coupled to the emitter contact 114. Thus, an electric current due to hole carriers conducted along the first trench 101 results in a lower feedback on the gate electrode structure 107 controlling the conductivity within channel portion 116 than in an arrangement including the gate electrode structure 107 not only in the second trench 102 but also in the first trench 101. In latter case, the hole current would cause a feedback on the gate electrode structure in the first trench. In the embodiment illustrated in FIG. 1, a low feedback of a hole current on the gate electrode structure 107 controlling the conductivity within the channel portion 116 is achieved by omitting the source structure at the first sidewall 110 of the first trench 101 and by electrically coupling the electrode structure 106 within the first trench 101 to the emitter contact 114.

According to other embodiments, lowering the feedback of the hole current on the gate electrode structure 107 may be achieved by alternative measures of equal effect such as increasing a thickness of the insulating structure 105 within the first trench 101, i.e. reducing a capacitive coupling between the body region 109 and the base region 117 on the one side and the electrode structure 106 within the first trench 101 on the other side, electrically coupling the electrode structure 106 within the first trench 101 to a region different from the gate electrode structure 107 within the second trench 102, i.e. electrically decoupling the electrode structure 106 within the first trench 101 from the gate electrode structure 107 within the second trench 102.

In the embodiment illustrated in FIG. 1, the body region 109, the collector region 118 and the electrically floating semiconductor zone 120 are of p-type, whereas the source structure 112 and the base region 117 are of n-type. According to other embodiments the type of dopant, i.e. p-type or n-type, of these regions may also be vice versa.

The semiconductor body 103 may be of a semiconductor material such as Si, SiGe, SiC or a combination thereof, for example. The semiconductor body 103 may include a semiconductor substrate and one or a plurality of epitaxial layers. As an example, the base zone 117 may be an epitaxial layer formed on the collector region 118 constituting the semiconductor substrate. A thickness of the base zone may be appropriately chosen to meet the requirements of a desired device voltage class.

The emitter contact 114 on the surface 104 of the IGBT 100, e.g., on a front side of the IGBT 100, may be formed of a metal such as Al, Cu, Ag, Pd or a combination thereof. Likewise, the collector contact may be formed of a metal such as as Al, Cu, Ag, Pd or a combination thereof.

Doped semiconductor regions such as body region 109, source zone 112 and electrically floating semiconductor zone 120 may be formed by implant of dopants into semiconductor body 103 and annealing or by diffusion of dopants into the semiconductor body 103, for example.

The term electrically floating used herein refers to a semiconductor region that is electrically decoupled from its surrounding, e.g., by a dielectric insulation or by a junction insulation such as a pn-junction.

In the embodiment illustrated in the schematic cross-sectional view of FIG. 1, the first trench 101 is arranged next to opposing sides of the second trench 102, one of the first trenches 101 is arranged opposed to the first sidewall 111 of the second trench 102 and another one of the first trenches 101 is arranged opposed to the second sidewall 113 of the second trench 103. IGBT 100 may include one or a plurality of active cells, wherein each cell may include the first and second trenches 101, 102 in the shape of stripes, for example. According to another embodiment, the cells may also be of square, rectangular or circular shape including trenches in the shape of a grid or ring, for example.

In the embodiment illustrated in the schematic cross-sectional view of FIG. 1, the first trench 101 and the second trench 102 extend to a same depth into semiconductor body 103. According to other embodiments, these trenches may have different depths. IGBT 100 may include further insulating regions such as regions 130a, 130b.

Figure 2:
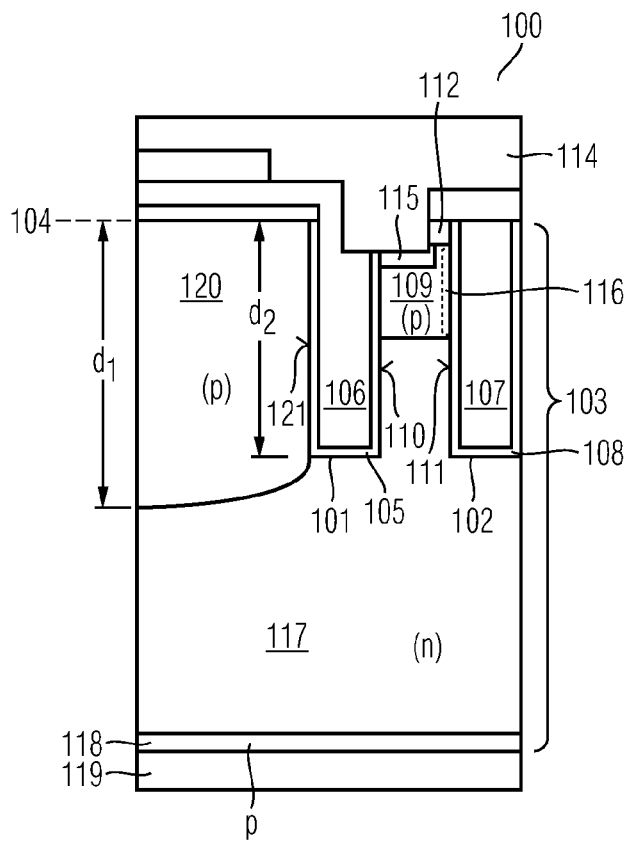
FIG. 2 illustrates a portion of the cross-sectional view of the IGBT illustrated in FIG. 1.

FIG. 2 illustrates a portion of the cross-sectional view of the IGBT 100 of FIG. 1. In particular, in FIG. 2 and subsequent figures redundant device portions such as one of two symmetric portions of an IGBT cell are omitted.

Figure 3:
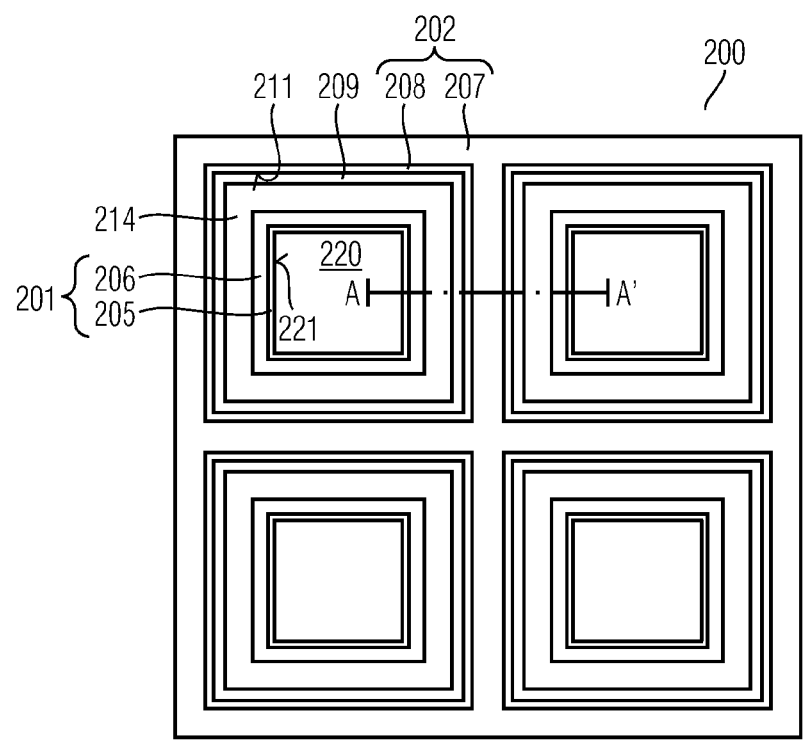
FIG. 3 illustrates a schematic plan view of a portion of an IGBT cell array including an electrically floating semiconductor zone according to an embodiment.

FIG. 3 is a schematic plan view of a portion of an IGBT cell array arrangement including square-shaped cells according to an embodiment. A cross-sectional view along a cut line AA' may correspond to the schematic cross-sectional view illustrated in FIG. 1. IGBT 200 includes a second trench 202 in grid-form having a gate electrode structure 207 and a gate dielectric structure 208. A body region 209 in the shape of a square loop adjoins to a first sidewall 211 of the second trench 202. A first trench 201 in the shape of a square loop including an electrode structure 206 and an insulating structure 205 adjoins to the body region 209. An interface between the first trench 201 and the body region 209 such as the first sidewall 110 illustrated in the cross-sectional view of FIG. 1 is not visible in FIG. 3 due to coverage by an emitter contact 214 electrically coupled to the electrode structure 206, body region 206 and a source zone. A source zone corresponding to source zone 112 illustrated in the cross-sectional view of FIG. 1 is not depicted in the plan view of FIG. 3. Instead, body region 206 is illustrated. An electrically floating square shaped semiconductor zone 220 adjoins the first trench 202. In the illustrated portion of IGBT 200 in FIG. 3, four IGBT cells are depicted. IGBT 200 may include more cells than illustrated in FIG. 3.

In the various embodiments illustrated above and below, similar elements will be denoted by similar reference signs. For example, an element such as the first trench 101 in FIG. 1 will be denoted by reference signs 301, 331, 361, 401, 431, 461, 491, 521, 551, 581, 611, 641, 671, 701, 731, 761, 791 in the various embodiments described below. With regard to elements illustrated in FIGS. 4 to 20, reference is also taken to similar elements described above with regard to the embodiment of FIG. 1.

Figure 4:
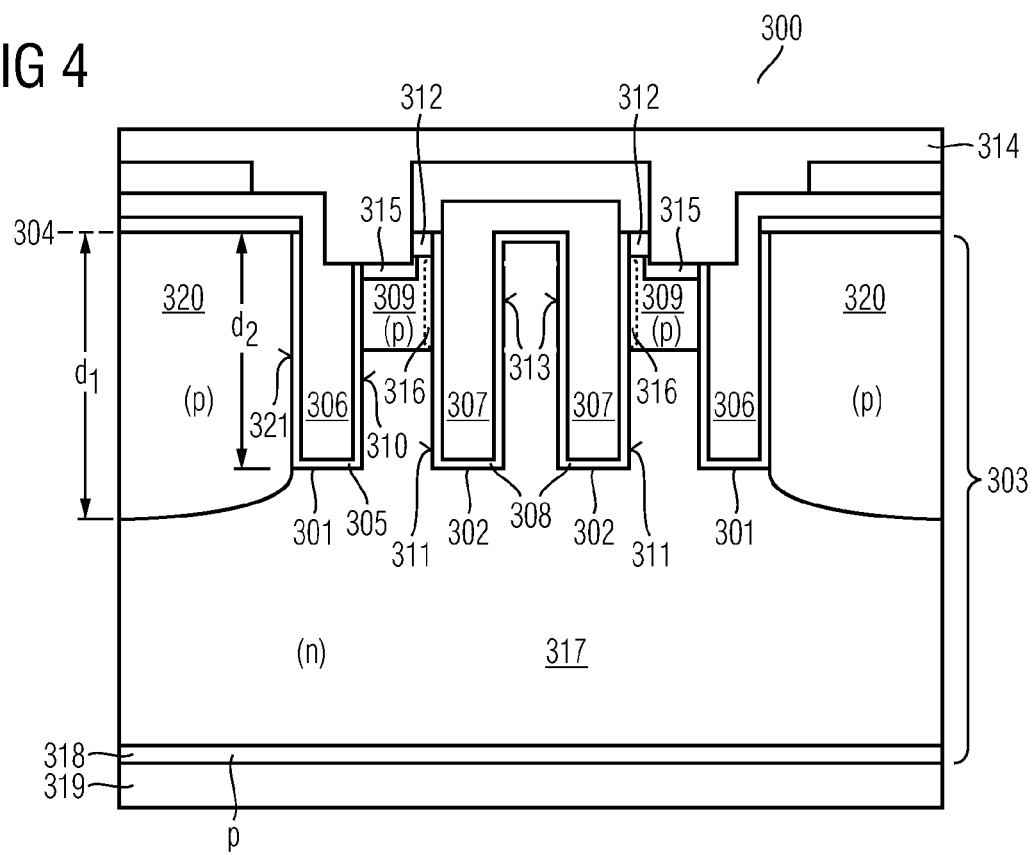
FIG. 4 illustrates a cross-sectional view of a portion of an IGBT including a gate electrode structure within a trench and a channel portion formed on one sidewall of the trench.

FIG. 4 illustrates a cross-sectional view of a portion of an IGBT 300. Similar to IGBT 100 illustrated in FIG. 1, IGBT 300 includes a semiconductor body 303, an insulating structure 305 and an electrode structure 306 within first trenches 301, a p-type body region 309, an n-type source zone 312, a p-type contact region 315, an emitter contact 314, a p-type electrically floating semiconductor zone 320, an n-type base zone 317, a p-type collector region 318 and a collector contact 319.

IGBT 300 includes two second trenches 302 arranged next to each other, each of which including a gate dielectric structure 308 and a gate electrode structure 307. Between opposing sidewalls 313 of the two second trenches 302, body region 319 is omitted. Thus, a channel portion 316 is only formed on one of two opposing sidewalls of each of the two second trenches 302, in particular that sidewall 311 of each of the two second trenches 302 which adjoins to the body region 309. The embodiment illustrated in FIG. 4 provides the benefit of a low on-state resistance. Yet another benefit of the embodiment disclosed in FIG. 4 is an improved conductivity, e.g., conductivity of polysilicon, of the gate electrode structure 307 within the second trenches 302, in particular in case of a gate electrode structure 307 of polysilicon that has not been doped in-situ. When increasing the distance between the two second trenches 302, a higher feedback on the gate electrode structure 307 may be continuously achieved.

Figure 5:
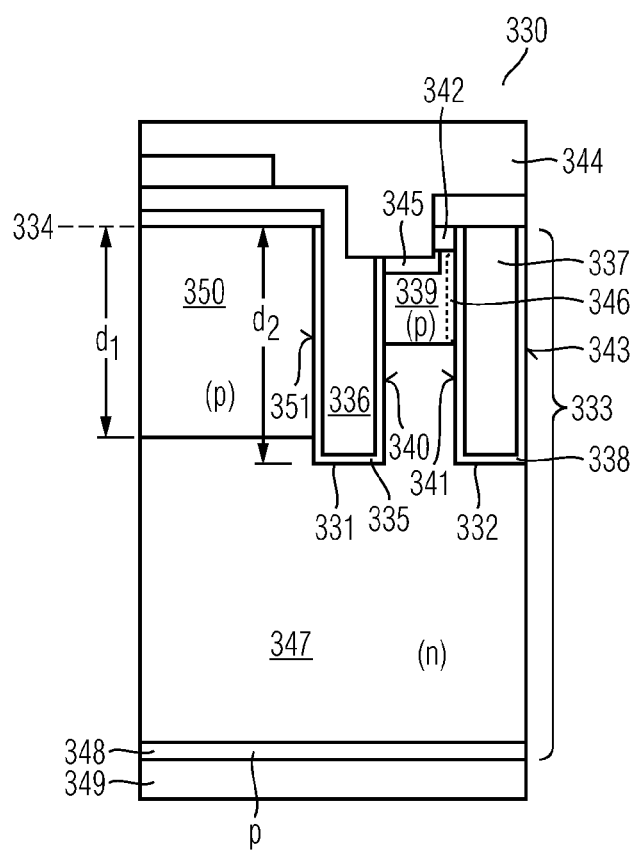
FIG. 5 illustrates a cross-sectional view of a portion of an IGBT including an electrically floating semiconductor zone adjoining to a trench, wherein a bottom side of the trench is arranged deeper within a semiconductor body than the bottom side of the electrically floating semiconductor zone.

FIG. 5 illustrates a cross-sectional view of a portion of an IGBT 330. Similar to IGBT 100 illustrated in FIG. 1, IGBT 330 includes a semiconductor body 333, an insulating structure 335 and an electrode structure 336 within a first trench 331, a gate dielectric structure 338 and a gate electrode structure 337 within a second trench 332, a p-type body region 339 including a channel portion 346, an n-type source zone 342, a p-type contact region 345, an emitter contact 344, an n-type base zone 347, a p-type collector region 348 and a collector contact 349.

IGBT 330 includes a p-type electrically floating semiconductor zone 350 having a bottom side in a depth $d_1$ with regard to a surface 334 of the semiconductor body 333 which is smaller than the depth $d_2$ of the bottom side of the first trench 331.

Figure 6:
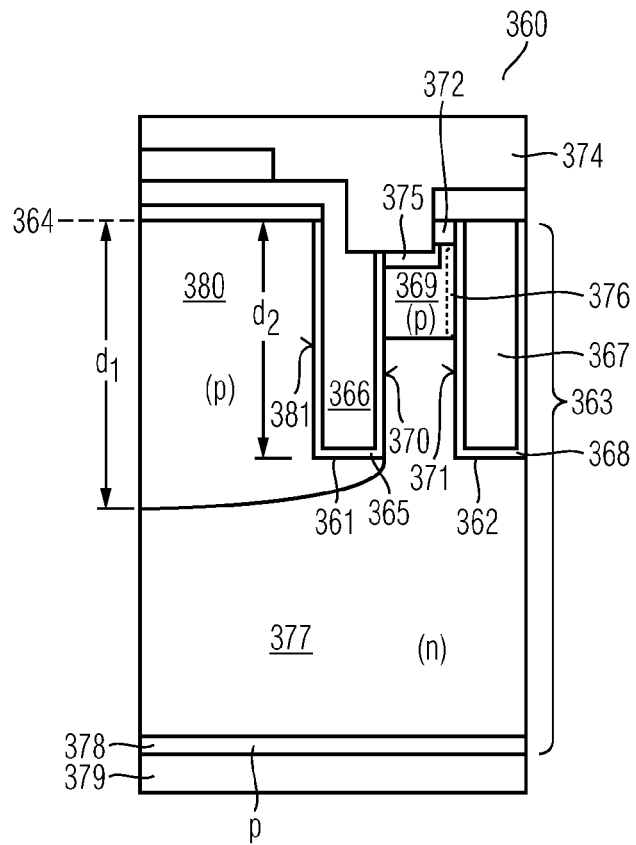
FIG. 6 illustrates a cross-sectional view of a portion of an IGBT including an electrically floating semiconductor zone adjoining to a bottom side of a trench.

FIG. 6 illustrates a cross-sectional view of a portion of an IGBT 360. Similar to IGBT 100 illustrated in FIG. 1, IGBT 360 includes a semiconductor body 363, an insulating structure 365 and an electrode structure 366 within a first trench 361, a gate dielectric structure 368 and a gate electrode structure 367 within a second trench 362, a p-type body region 369 including a channel portion 376, an n-type source zone 372, a p-type contact region 375, an emitter contact 374, an n-type base zone 377, a p-type collector region 378 and a collector contact 379.

IGBT 360 includes a p-type electrically floating semiconductor zone 350 that adjoins to a bottom side of the first trench 361. The embodiment illustrated in FIG. 6 is configured to counteract the occurrence of high peak values of an electric field at a bottom edge of the first and second trenches 361, 362 in reverse or short-circuit mode.

Figure 7:
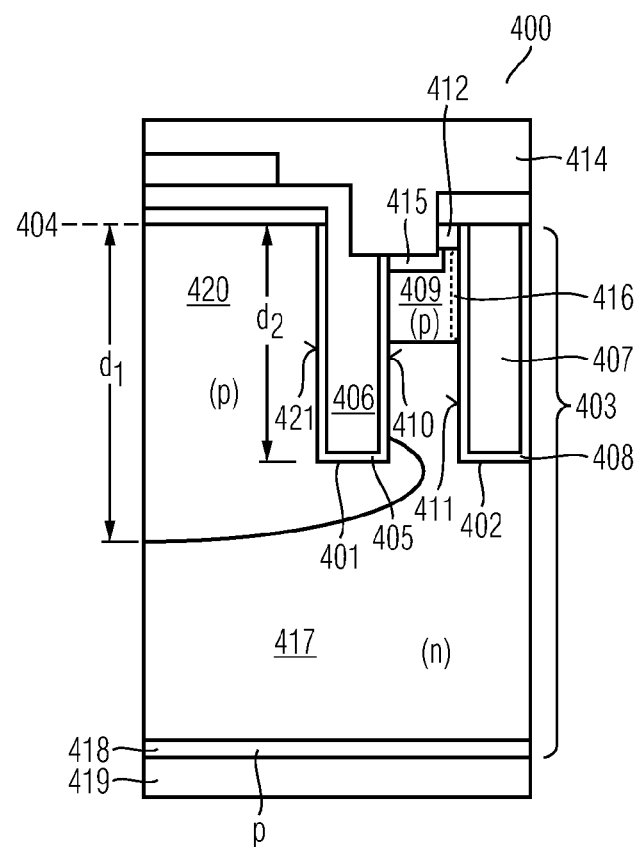
FIG. 7 illustrates a cross-sectional view of a portion of an IGBT including an electrically floating semiconductor zone adjoining to opposing sidewalls of a trench.

FIG. 7 illustrates a cross-sectional view of a portion of an IGBT 400. Similar to IGBT 100 illustrated in FIG. 1, IGBT 400 includes a semiconductor body 403, an insulating structure 405 and an electrode structure 406 within a first trench 401, a gate dielectric structure 408 and a gate electrode structure 407 within a second trench 402, a p-type body region 409 including a channel portion 416, an n-type source zone 412, a p-type contact region 415, an emitter contact 414, an n-type base zone 417, a p-type collector region 418 and a collector contact 419.

IGBT 400 includes a p-type electrically floating semiconductor zone 420 that adjoins to a bottom side and to opposing sidewalls, i.e. a first sidewall 410 and a second sidewall 421, of the first trench 401. In particular, p-type electrically floating semiconductor zone 420 adjoins to the second sidewall 421 and encompasses a lower portion of the first trench 401 such that it adjoins to the bottom side and to a lower portion of the first sidewall 410 of the first trench 401. One embodiment illustrated in FIG. 7 is configured to counteract the occurrence of high peak values of an electric field at a bottom edge of the first and second trenches 401, 402 in reverse or short-circuit mode.

Figure 8:
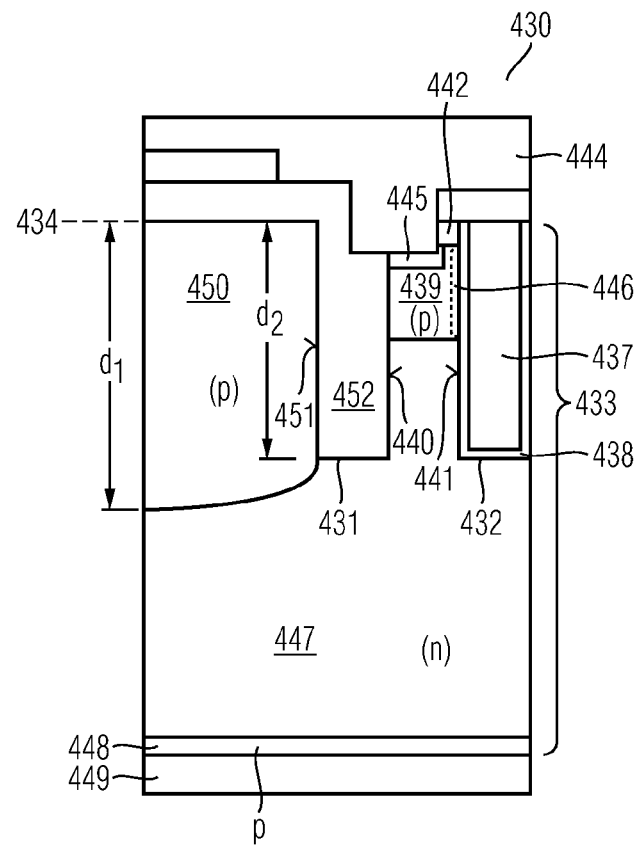
FIG. 8 illustrates a cross-sectional view of a portion of an IGBT including an electrically floating semiconductor zone adjoining to a trench filled with dielectric material.

FIG. 8 illustrates a cross-sectional view of a portion of an IGBT 430. Similar to IGBT 100 illustrated in FIG. 1, IGBT 430 includes a semiconductor body 433, a gate dielectric structure 438 and a gate electrode structure 437 within a second trench 432, a p-type body region 439 including a channel portion 446, an n-type source zone 442, a p-type contact region 445, an emitter contact 444, an n-type base zone 447, a p-type collector region 448 and a collector contact 449.

IGBT 430 includes a first trench 431 filled with an insulating material 452 such as $SiO_2$. Thus, a thin dielectric layer within the first trench 431 is omitted, the reliability of which, different from a gate dielectric, may only be verified with effort.

Figure 9:
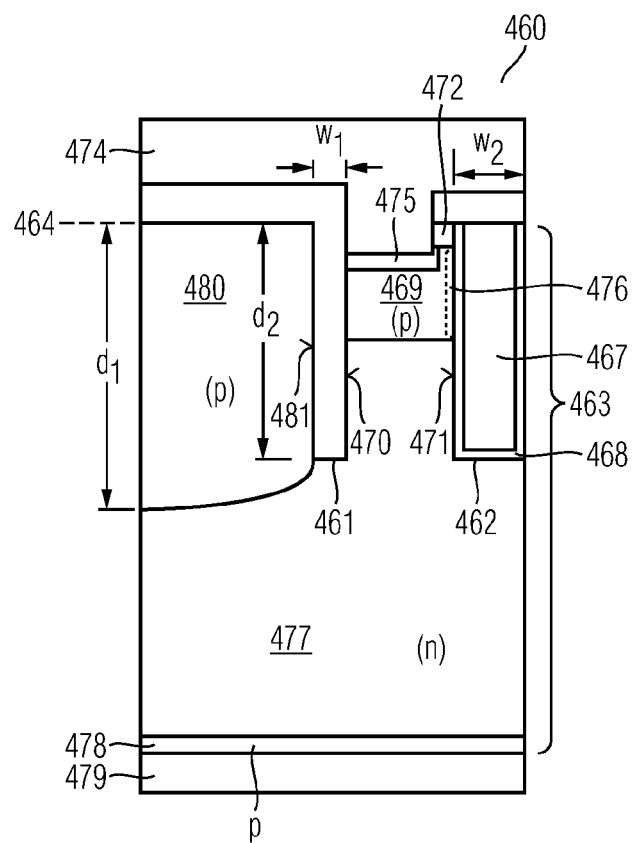
FIG. 9 illustrates a cross-sectional view of a portion of an IGBT including an electrically floating semiconductor zone adjoining to a trench filled with dielectric material, wherein a width of the trench filled with dielectric material is smaller than the width of the trench including a gate electrode structure.

FIG. 9 illustrates a cross-sectional view of a portion of an IGBT 460. Similar to IGBT 100 illustrated in FIG. 1, IGBT 460 includes a semiconductor body 463, a gate dielectric structure 468 and a gate electrode structure 467 within a second trench 462, p-type body region 469 including a channel portion 476, an n-type source zone 472, a p-type contact region 475, an emitter contact 474, an n-type base zone 477, a p-type collector region 478 and a collector contact 479.

IGBT 460 includes a first trench 461 filled with an insulating material 482 such as $SiO_2$. Furthermore, a width $w_1$ of the first trench 461 is smaller than the width $w_2$ of the second trench 462. Thus, filling the first trench 461 with the insulating material 482 and stress induced by the first trench 461 and its filling may be beneficial with regard to a trench of larger width.

Figure 10:
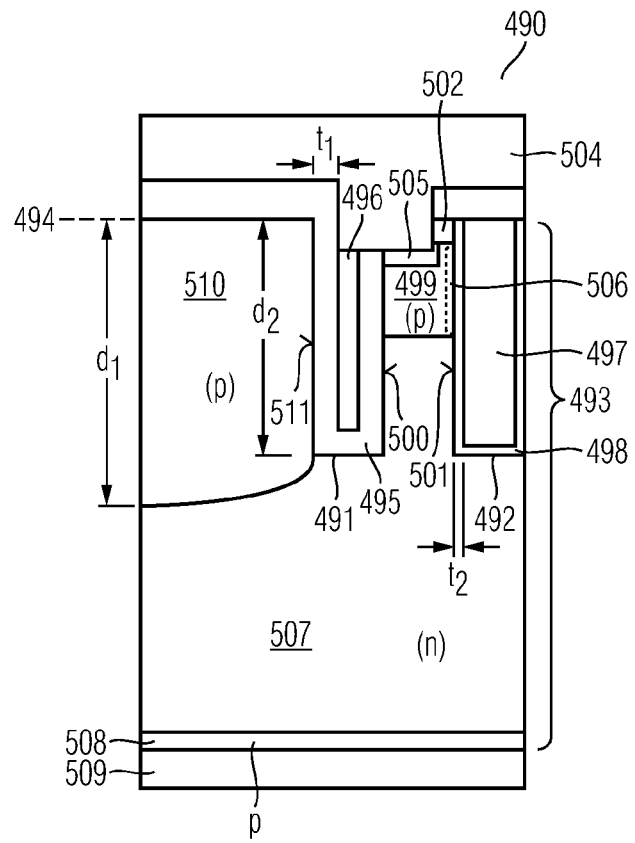
FIG. 10 illustrates a cross-sectional view of a portion of an IGBT including an electrically floating semiconductor zone adjoining to a trench and a first arrangement of an electrode structure within the trench.

FIG. 10 illustrates a cross-sectional view of a portion of an IGBT 490. Similar to IGBT 100 illustrated in FIG. 1, IGBT 490 includes a semiconductor body 493, an insulating structure 495 and an electrode structure 496 within a first trench 491, a gate dielectric structure 498 and a gate electrode structure 497 within a second trench 492, a p-type body region 499 including a channel portion 506, an n-type source zone 502, a p-type contact region 505, an emitter contact 504, an n-type base zone 507, a p-type collector region 508 and a collector contact 509.

The insulating structure 495 within the first trench 491 of IGBT 490 has a thickness $t_1$ larger than the thickness $t_2$ of the gate dielectric structure 498. The increased thickness of the insulating structure 495 within the first trench 491 provides the benefit of an increased safety margin with regard to a breakdown voltage of this insulating structure that may be applied during operation conditions.

Figure 11:
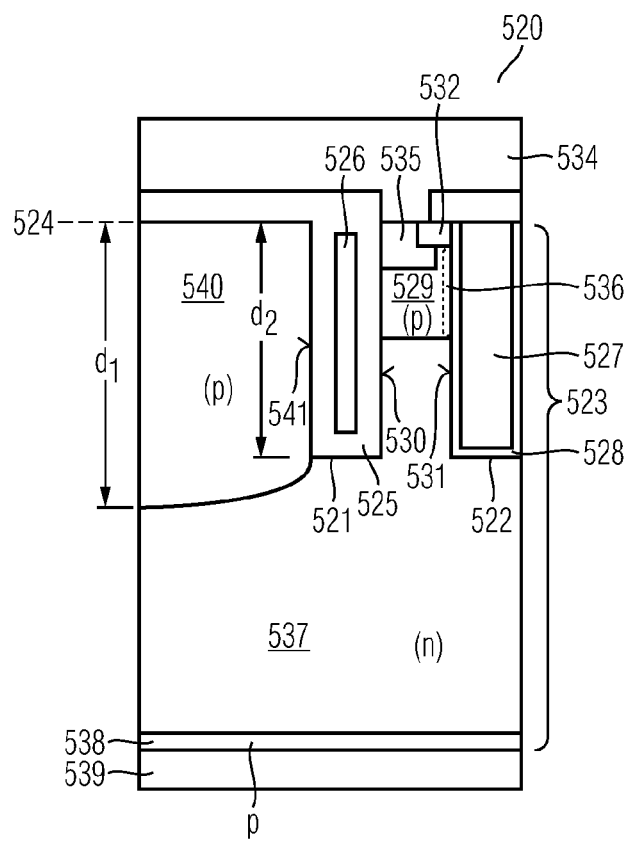
FIG. 11 illustrates a cross-sectional view of a portion of an IGBT including an electrically floating semiconductor zone adjoining to a trench and a second arrangement of an electrode structure within the trench.

FIG. 11 illustrates a cross-sectional view of a portion of an IGBT 520. Similar to IGBT 100 illustrated in FIG. 1, IGBT 520 includes a semiconductor body 523, an insulating structure 525 and an electrode structure 526 within a first trench 521, a gate dielectric structure 528 and a gate electrode structure 527 within a second trench 522, a p-type body region 529 including a channel portion 536, an n-type source zone 532, a p-type contact region 535, an emitter contact 534, an electrically floating semiconductor zone 540, an n-type base zone 537, a p-type collector region 538 and a collector contact 539.

The insulating structure 525 within the first trench 521 of IGBT 520 has a thickness $t_1$ larger than the thickness $t_2$ of the gate dielectric structure 528. The increased thickness of the insulating structure 525 within the first trench 521 provides an increased safety margin with regard to a breakdown voltage of this insulating structure that may be applied during operation conditions. Furthermore, the electrode structure 526 within the first trench 521 may be electrically floating as illustrated in FIG. 11. The electrode structure 526 within the first trench 521 may also be electrically coupled to the emitter contact 534 or to the gate electrode structure 527 within the second trench 522.

Figure 12:
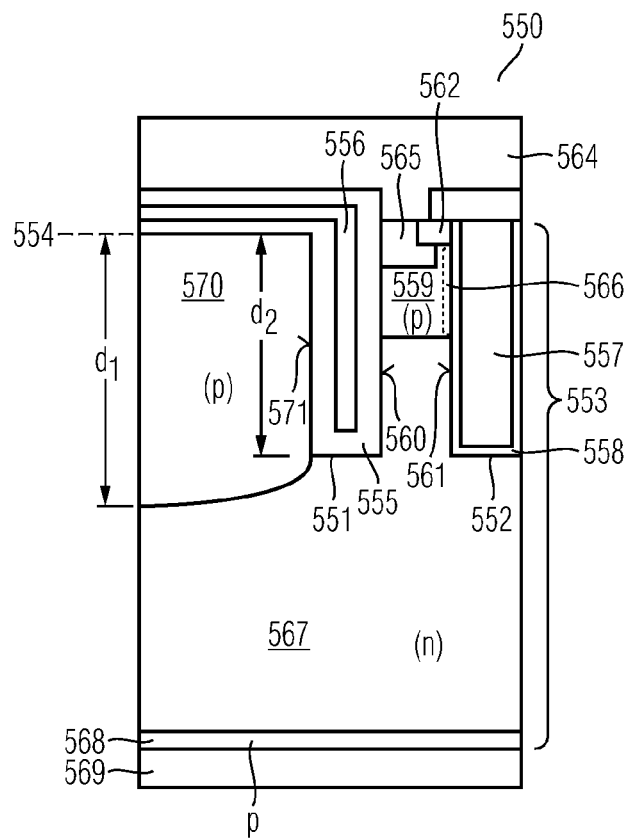
FIG. 12 illustrates a cross-sectional view of a portion of an IGBT including an electrically floating semiconductor zone adjoining to a trench and a third arrangement of an electrode structure within the trench.

FIG. 12 illustrates a cross-sectional view of a portion of an IGBT 550. Similar to IGBT 520 illustrated in FIG. 11, IGBT 550 includes a semiconductor body 553, an insulating structure 555 and an electrode structure 556 within a first trench 551, a gate dielectric structure 558 and a gate electrode structure 557 within a second trench 552, a thickness $t_1$ of the insulating structure 555 being larger than the thickness $t_2$ of the gate dielectric structure 558, a p-type body region 559 including a channel portion 566, an n-type source zone 562, a p-type contact region 565, an emitter contact 564, an electrically floating semiconductor zone 570, an n-type base zone 567, a p-type collector region 568 and a collector contact 569.

The electrode structure 556 extends over the surface 524 of semiconductor body 554 to the electrode.

Figure 13:
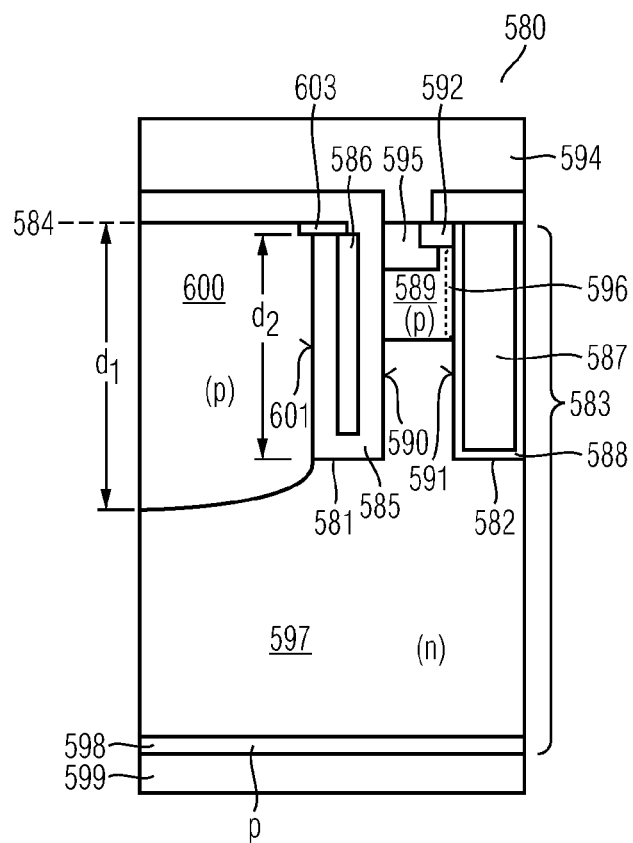
FIG. 13 illustrates a cross-sectional view of a portion of an IGBT including an electrically floating semiconductor zone adjoining to a trench and a fourth arrangement of an electrode structure within the trench.

FIG. 13 illustrates a cross-sectional view of a portion of an IGBT 580. Similar to IGBT 520 illustrated in FIG. 11, IGBT 580 includes a semiconductor body 583, an insulating structure 585 and an electrode structure 586 within a first trench 581, a gate dielectric structure 588 and a gate electrode structure 587 within a second trench 582, a thickness $t_1$ of the insulating structure 585 being larger than the thickness $t_2$ of the gate dielectric structure 588, a p-type body region 589 including a channel portion 596, an n-type source zone 592, a p-type contact region 595, an emitter contact 594, an electrically floating semiconductor zone 600, an n-type base zone 597, a p-type collector region 598 and a collector contact 599.

The electrode structure 586 is electrically coupled to the electrically floating semiconductor zone 600 via a conductive strap 603, e.g., a metal strap or doped semiconductor strap, at the surface 584 of the semiconductor body 583. Thus, the electrode structure 586 is electrically floating similar to the semiconductor zone 600. The conductive strap 603 may be formed in different ways, e.g., by utilizing metal layers and contact plugs. This also applies to the embodiment illustrated in FIG. 12.

Figure 14:
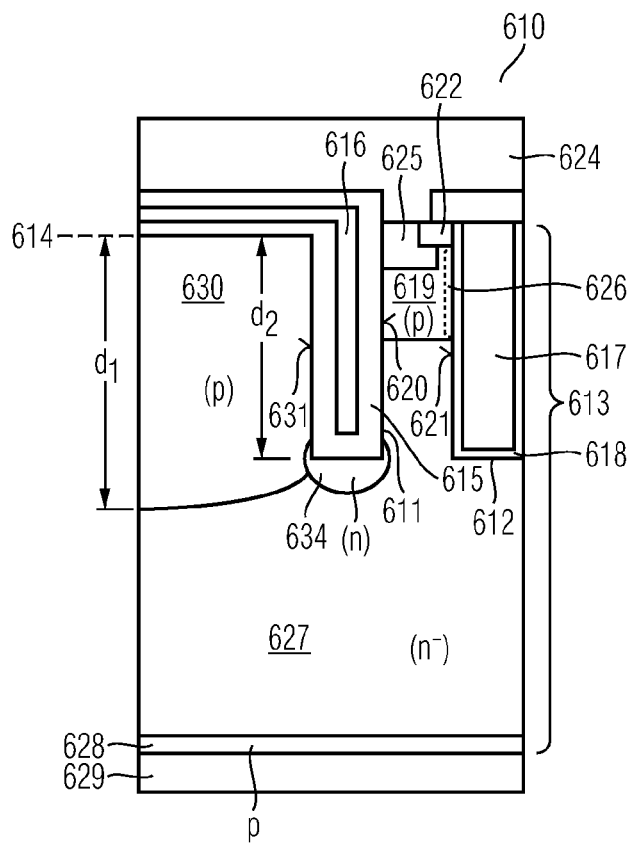
FIG. 14 illustrates a cross-sectional view of a portion of an IGBT including an electrically floating semiconductor zone adjoining to a trench and a first arrangement of a semiconductor zone adjoining to the electrically floating semiconductor zone.

FIG. 14 illustrates a cross-sectional view of a portion of an IGBT 610. Similar to IGBT 550 illustrated in FIG. 12, IGBT 610 includes a semiconductor body 613, an insulating structure 615 and an electrode structure 616 within a first trench 611, a gate dielectric structure 618 and a gate electrode structure 617 within a second trench 612, a thickness $t_1$ of the insulating structure 611 being larger than the thickness $t_2$ of the gate dielectric structure 618, a p-type body region 619 including a channel portion 626, an n-type source zone 622, a p-type contact region 625, an emitter contact 624, an electrically floating semiconductor zone 630, an n-type base zone 627, a p-type collector region 628 and a collector contact 629.

In addition to IGBT 550 illustrated in FIG. 12, IGBT 610 includes an n-type semiconductor zone 634 adjoining to a bottom side of the first trench 611. A dopant density of the n-type semiconductor zone 634 is larger than the dopant density of the n-type base zone 627. As an example the dopant density of the semiconductor zone 634 may be a factor of 10, 100 or even 1000 larger than the dopant density of the n-type base zone 627. The n-type semiconductor zone 634 is configured to localize a breakdown region during a reverse mode of IGBT 610 to a bottom region of the first trench 611 away from the gate electrode structure within the second trench 612. The n-type semiconductor zone 634 may be formed by implant of dopants via a bottom side of the first trench 611 prior to filling up this trench. In case of a semiconductor body 613 made of silicon, an implant dose may be in the order of $10^{12}$ cm$^{-2}$.

Figure 15:
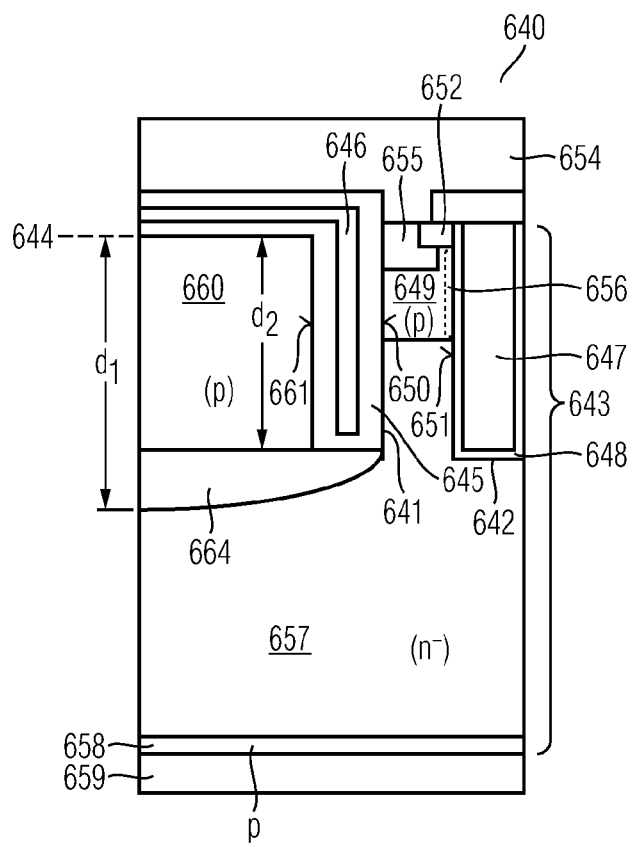
FIG. 15 illustrates a cross-sectional view of a portion of an IGBT including an electrically floating semiconductor zone adjoining to a trench and a second arrangement of a semiconductor zone adjoining to the electrically floating semiconductor zone.

FIG. 15 illustrates a cross-sectional view of a portion of an IGBT 640. Similar to IGBT 610 illustrated in FIG. 14, IGBT 640 includes a semiconductor body 643, an insulating structure 645 and an electrode structure 646 within a first trench 641, a gate dielectric structure 648 and a gate electrode structure 647 within a second trench 642, a thickness $t_1$ of the insulating structure 641 being larger than the thickness $t_2$ of the gate dielectric structure 648, a p-type body region 649 including a channel portion 656, an n-type source zone 652, a p-type contact region 655, an emitter contact 654, an electrically floating semiconductor zone 660, an n-type semiconductor zone 664, an n-type base zone 657, a p-type collector region 658 and a collector contact 659.

The n-type semiconductor zone 664 adjoins to both a bottom side of the first trench 641 and the bottom side of the electrically floating semiconductor zone 660.

Figure 16:
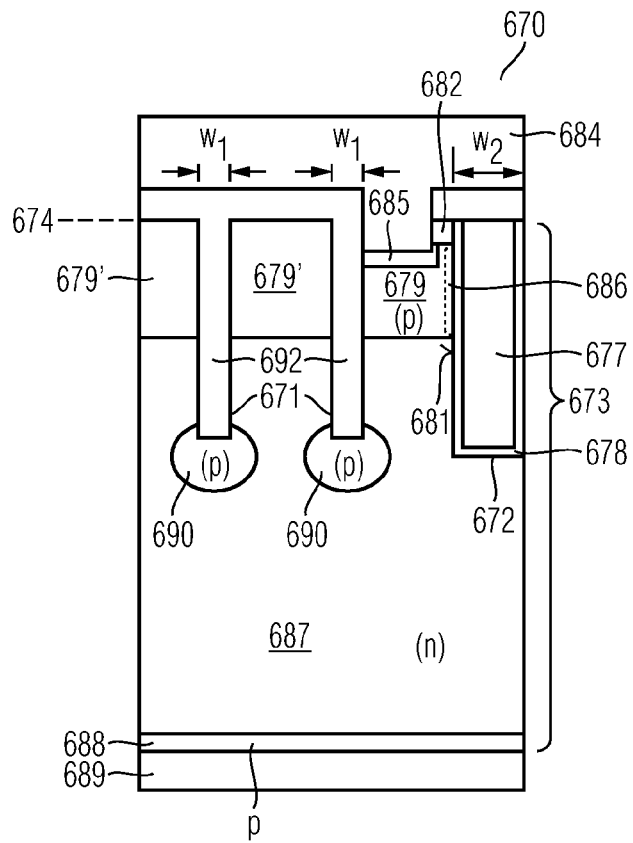
FIG. 16 illustrates a cross-sectional view of a portion of an IGBT including a first arrangement of an electrically floating semiconductor zone adjoining to a trench at a bottom portion of the trench.

FIG. 16 illustrates a cross-sectional view of a portion of an IGBT 670. Similar to IGBT 460 illustrated in FIG. 9, IGBT 670 includes a semiconductor body 673, a first trench 671 filled with an insulating material 692, a gate dielectric structure 678 and a gate electrode structure 677 within a second trench 672, a p-type body region 679 including a channel portion 686 and, in addition, a p-type electrically floating body region 679', an n-type source zone 682, a p-type contact region 685, an emitter contact 684, a p-type electrically floating semiconductor zone 690, an n-type base zone 687, a p-type collector region 688 and a collector contact 689.

IGBT 670 includes a plurality of first trenches 671 arranged next to each other. Furthermore, the p-type electrically floating semiconductor zone 690 does not adjoin to the surface 674 of the semiconductor body 673, but merely surrounds a lower portion of the first trench 671. The semiconductor zone 690 may be formed by implant of dopants into the semiconductor body 673 via a bottom side of the first trench 671 prior to filling up this trench and subsequent annealing.

Figure 17:
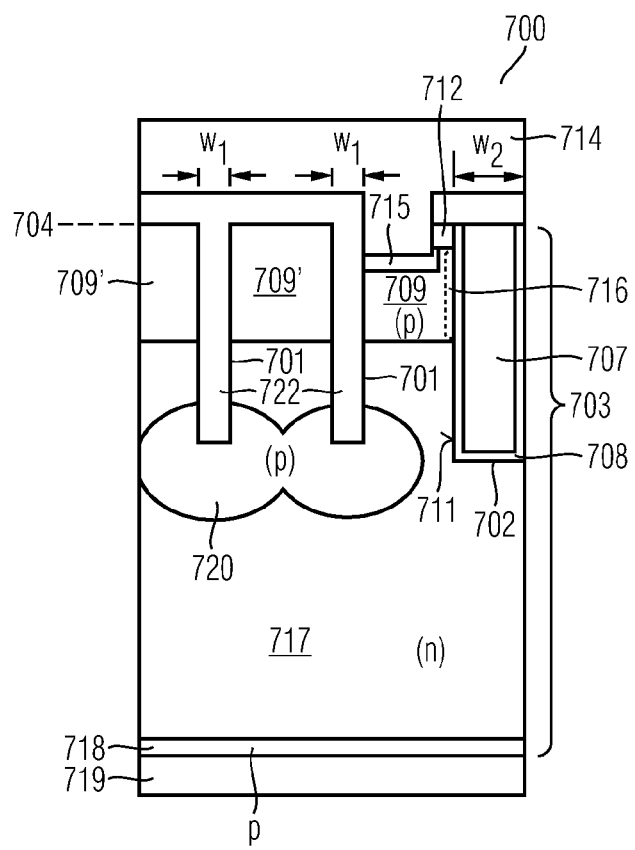
FIG. 17 illustrates a cross-sectional view of a portion of an IGBT including a second arrangement of an electrically floating semiconductor zone adjoining to a trench at a bottom portion of the trench.

FIG. 17 illustrates a cross-sectional view of a portion of an IGBT 700. Similar to IGBT 670 illustrated in FIG. 16, IGBT 700 includes a semiconductor body 703, a first trench 701 filled with an insulating material 722, a gate dielectric structure 708 and a gate electrode structure 707 within a second trench 702, a p-type body region 709 including a channel portion 716, a p-type electrically floating body region 709', an n-type source zone 712, a p-type contact region 715, an emitter contact 715, a p-type electrically floating semiconductor zone 720, an n-type base zone 717, a p-type collector region 718 and a collector contact 719.

The p-type floating semiconductor zone 720 adjoining to one of the first trenches IGBT 700 overlaps with the p-type electrically floating semiconductor zone 720 associated with a neighboring one of the first trenches 701. Adjustment of overlap or non-overlap of the electrically floating semiconductor zones such as zones 690 illustrated in FIG. 16 (an example of overlap) may be determined by a thermal budget when annealing the implanted dopants of these zones.

Figure 18:
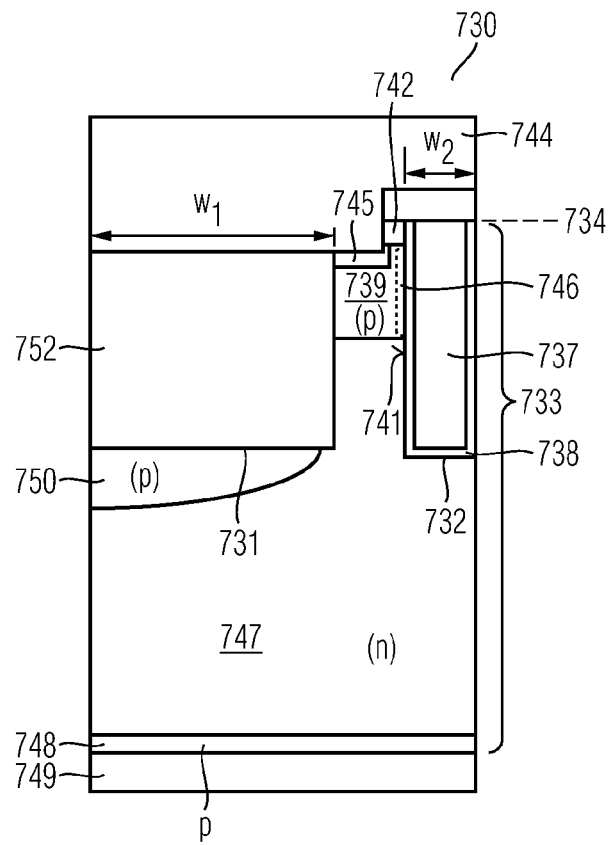
FIG. 18 illustrates a cross-sectional view of a portion of an IGBT including an electrically floating semiconductor zone adjoining to a bottom side of a trench filled with dielectric material.

FIG. 18 illustrates a cross-sectional view of a portion of an IGBT 730. Similar to IGBT 100 illustrated in FIG. 1, IGBT 730 includes a semiconductor body 733, a gate dielectric structure 738 and a gate electrode structure 737 within a second trench 732, a p-type body region 739 including a channel portion 746, an n-type source zone 742, a p-type contact region 745, an emitter contact 744, a p-type electrically floating semiconductor zone 750, an n-type base zone 747, a p-type collector region 748 and a collector contact 749.

The first trench 731 is filled with an insulating material 752 such as $SiO_2$. Furthermore, a width $w_1$ of the first trench 731 is larger than the width $w_2$ of the second trench 732. The p-type electrically floating semiconductor zone 750 is arranged below the first trench 731 and adjoins to a bottom side of the first trench 731.

Figure 19:
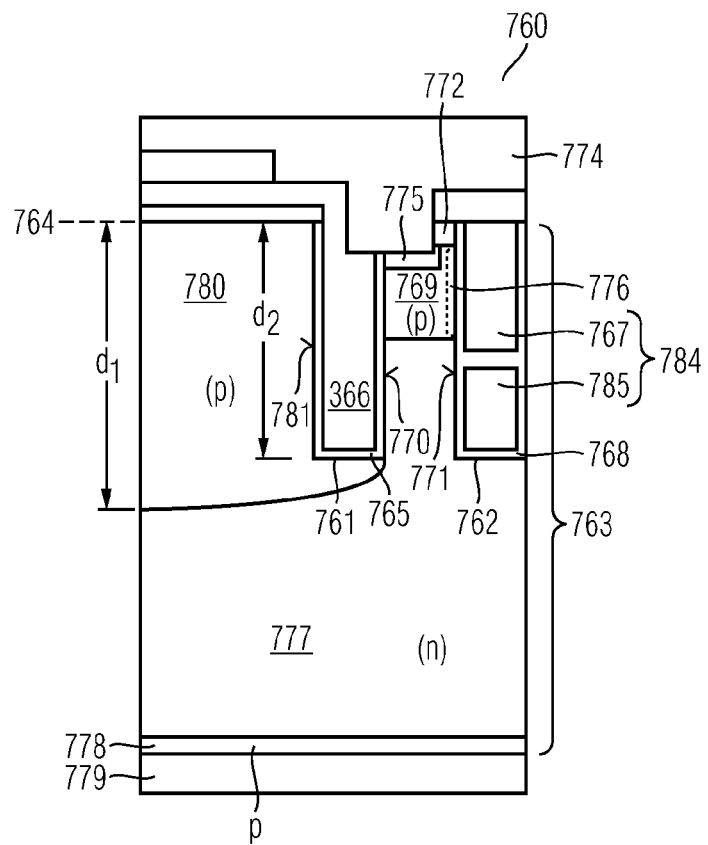
FIG. 19 illustrates a cross-sectional view of a portion of an IGBT including an electrically floating semiconductor zone adjoining to a trench and a first arrangement of a segmented electrode structure.

FIG. 19 illustrates a cross-sectional view of a portion of an IGBT 760. Similar to IGBT 100 illustrated in FIG. 1, IGBT 760 includes a semiconductor body 763, an insulating structure 765 and an electrode structure 766 within a first trench 761, a gate dielectric structure 768 and a gate electrode structure 767 within a second trench 762, a p-type body region 769 including a channel portion 776, an n-type source zone 772, a p-type contact region 775, an emitter contact 774, a p-type electrically floating semiconductor zone 780, an n-type base zone 777, a p-type collector region 778 and a collector contact 779.

The gate electrode structure 767 of IGBT 760 constitutes an upper electrode of an electrode structure 784, the upper electrode 767 being electrically insulated from a lower electrode 785. The lower electrode 785 may be electrically floating or electrically coupled to an auxiliary supply, e.g., to the emitter voltage. A positive auxiliary supply voltage may increase the accumulation of hole carriers within semiconductor body 763 during operation conditions and may reduce a saturation voltage between the emitter contact 774 and the collector contact 779. The gate electrode structure 767 may extend from the surface 764 to a bottom side of the body region 769 or even deeper into the semiconductor body 763. Reducing the vertical dimensions of the gate electrode structure 767 within the second trench 762 by segmenting the electrode structure in two or even more parts allows to reduce the capacitance between gate and drain, i.e. between the gate electrode structure 776 and the n-type base zone 777.

Figure 20:
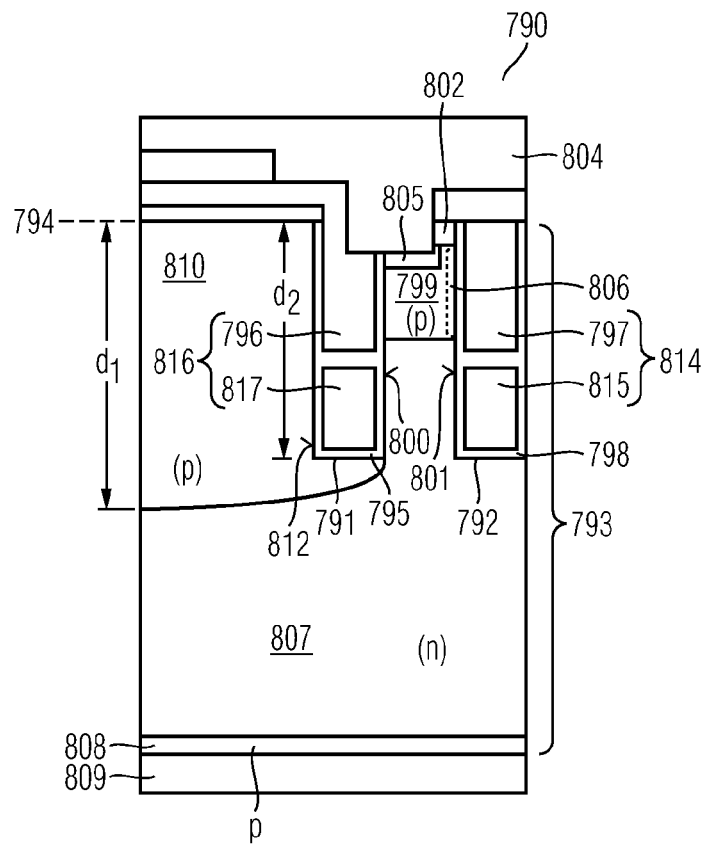
FIG. 20 illustrates a cross-sectional view of a portion of an IGBT including an electrically floating semiconductor zone adjoining to a trench and a second arrangement of a segmented electrode structure.

FIG. 20 illustrates a cross-sectional view of a portion of an IGBT 790. Similar to IGBT 760 illustrated in FIG. 19, IGBT 790 includes a semiconductor body 793, an insulating structure 795 and an electrode structure 796 within a first trench 791, a gate dielectric structure 798 and an electrode structure 814 including a gate electrode structure 797 as an upper electrode and a lower electrode 815 within a second trench 792, a p-type body region 799 including a channel portion 806, an n-type source zone 802, a p-type contact region 805, an emitter contact 804, a p-type electrically floating semiconductor zone 810, an n-type base zone 807, a p-type collector region 808 and a collector contact 809.

An electrode 816 within the first trench 791 is segmented into two electrodes electrically insulated from each other and includes the electrode structure 796 as an upper electrode and a lower electrode 817. The lower electrodes 815, 817 in the first and second trenches 791, 792 may be formed in same processing steps. Likewise, the upper electrodes 796, 797 in the first and second trenches 791, 792 may also be formed in same processing steps. Thereby, the manufacturing process may be simplified resulting in a same electrode arrangement in the first and second trenches 791, 792. The upper electrodes 796, 797 of the first and second trenches 791, 792 may be electrically coupled to each other. These electrodes may also be electrically decoupled.

It is to be understood that the features of the various embodiment embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first trench and a second trench extending into a semiconductor body from a surface, wherein the first trench and the second trench extend to a same depth into the semiconductor body;
a body region of a first conductivity type adjoining a first sidewall of the first trench and a first sidewall of the second trench, the body region including a channel portion adjoining a source structure and being configured to be controlled in its conductivity by a gate structure, an insulating structure and an electrode structure being formed in the first trench and the gate structure comprising a gate electrode structure and a gate dielectric structure being formed in the second trench, wherein the channel portion is formed at the first sidewall of the second trench and is not formed at the first sidewall of the first trench;
an electrically floating semiconductor zone of the first conductivity type adjoining the first trench and having a bottom side located deeper within the semiconductor body than a bottom side of the body region;

wherein a first semiconductor zone of a second conductivity type adjoins to a bottom side of the first trench, the first semiconductor zone having a larger dopant density than a second semiconductor zone of the second conductivity type adjoining to a bottom side of the body region, and wherein the first semiconductor zone adjoins to a bottom side of the electrically floating semiconductor zone of the first conductivity type.

2. A semiconductor device, comprising:
a first trench and a second trench extending into a semiconductor body from a surface, wherein the first trench and the second trench extend to a same depth into the semiconductor body;
a body region of a first conductivity type adjoining a first sidewall of the first trench and a first sidewall of the second trench, the body region including a channel portion adjoining a source structure and being configured to be controlled in its conductivity by a gate structure, wherein the channel portion is formed at the first sidewall of the second trench and is not formed at the first sidewall of the first trench; and
an electrically floating semiconductor zone of the first conductivity type adjoining to the first trench and having a bottom side located deeper within the semiconductor body than a bottom side of the body region,
wherein each of the first and second trench includes an insulating structure and an electrode structure.

3. The device of claim 2, wherein
a thickness of the insulating structure within the first trench is larger than the thickness of the insulating structure within the second trench.

4. The semiconductor device of claim 2 wherein
the electrode structure in the first trench is electrically floating.

5. The semiconductor device of claim 4, wherein
the electrode structure within the first trench is electrically coupled to the electrically floating semiconductor zone via a conductive strap.

6. The semiconductor device of claim 2, wherein
the electrode structure in the first trench is electrically coupled to the electrode structure in the second trench.

7. The semiconductor device of claim 2, wherein
the electrode structure in the first trench is electrically coupled to the source structure formed within the body region.

8. The semiconductor device of claim 2, wherein
the electrode structure in the second trench is segmented into at least two electrodes electrically insulated from each other.

9. The semiconductor device of claim 8, wherein
the electrode structure in the first trench is segmented into at least two electrodes electrically insulated from each other.

10. A semiconductor device, including:
a first trench and a second trench extending into a semiconductor body from a surface, wherein the first trench and the second trench extend to a same depth into the semiconductor body;
a body region of a first conductivity type adjoining to a first sidewall of the first trench and to a first sidewall of the second trench, a dopant density of a body portion adjoining to the first sidewall of the second trench being lower than the dopant density of the body portion adjoining the first sidewall of the first trench; and
an electrically floating semiconductor zone of the first conductivity type adjoining to the first trench and having a bottom side located deeper within the semiconductor body than the bottom side of the body region.

11. The semiconductor device of claim 10, wherein
a first semiconductor zone of a second conductivity type adjoins to a bottom side of the first trench, the first semiconductor zone having a larger dopant density than a second semiconductor zone of the second conductivity type adjoining to a bottom side of the body region.

12. The semiconductor device of claim 11, wherein the first semiconductor zone adjoins to a bottom side of the electrically floating semiconductor zone of the first conductivity type.

* * * * *